United States Patent
Cheng et al.

(10) Patent No.: US 7,833,891 B2
(45) Date of Patent: Nov. 16, 2010

(54) SEMICONDUCTOR DEVICE MANUFACTURING METHOD USING OXYGEN DIFFUSION BARRIER LAYER BETWEEN BURIED OXIDE LAYER AND HIGH K DIELECTRIC LAYER

(75) Inventors: Kagguo Cheng, Guilderland, NY (US); Bruce B. Doris, Brewster, NY (US)

(73) Assignee: International Business Machines Corporation, Armonk, NY (US)

(*) Notice: Subject to any disclaimer, the term of this patent is extended or adjusted under 35 U.S.C. 154(b) by 105 days.

(21) Appl. No.: 12/178,303

(22) Filed: Jul. 23, 2008

(65) Prior Publication Data

US 2010/0019358 A1 Jan. 28, 2010

(51) Int. Cl.
*H01L 21/28* (2006.01)
*H01L 29/423* (2006.01)
(52) U.S. Cl. ............... 438/591; 257/635; 257/E21.192; 257/E29.132
(58) Field of Classification Search ................. 438/591; 257/635, E21.192, E29.132; 716/1
See application file for complete search history.

(56) References Cited

U.S. PATENT DOCUMENTS

| | | |
|---|---|---|
| 5,436,186 A | 7/1995 | Hsue et al. |
| 5,457,065 A | 10/1995 | Huang et al. |
| 5,460,999 A | 10/1995 | Hong et al. |
| 5,716,884 A | 2/1998 | Hsue et al. |
| 6,403,434 B1 | 6/2002 | Yu |
| 6,495,437 B1 | 12/2002 | Yu |
| 6,524,920 B1 | 2/2003 | Yu |
| 6,534,395 B2 | 3/2003 | Werkhoven et al. |
| 6,551,885 B1 | 4/2003 | Yu |
| 6,660,660 B2 | 12/2003 | Haukka et al. |
| 6,703,708 B2 | 3/2004 | Werkhoven et al. |
| 6,756,277 B1 | 6/2004 | Yu |
| 6,787,424 B1 | 9/2004 | Yu |
| 6,933,225 B2 | 8/2005 | Werkhoven et al. |
| 7,067,360 B2 | 6/2006 | Lee |
| 7,071,122 B2 | 7/2006 | Saenger et al. |
| 7,105,390 B2 | 9/2006 | Brask et al. |
| 7,176,483 B2 | 2/2007 | Grupp et al. |
| 7,193,279 B2 | 3/2007 | Doyle et al. |
| 7,241,653 B2 | 7/2007 | Hareland et al. |
| 7,241,674 B2 | 7/2007 | Chan et al. |
| 7,268,058 B2 | 9/2007 | Chau et al. |
| 7,279,375 B2 | 10/2007 | Radosavljevic et al. |
| 7,304,336 B2 | 12/2007 | Cheng et al. |
| 7,326,634 B2 | 2/2008 | Lindert et al. |
| 7,326,656 B2 | 2/2008 | Brask et al. |
| 7,329,913 B2 | 2/2008 | Brask et al. |
| 7,348,284 B2 | 3/2008 | Doyle et al. |
| 7,358,121 B2 | 4/2008 | Chau et al. |
| 7,361,958 B2 | 4/2008 | Brask et al. |

(Continued)

*Primary Examiner*—Matthew S Smith
*Assistant Examiner*—Walter H Swanson
(74) *Attorney, Agent, or Firm*—Joseph P. Abate; Roberts Mlotkowski Safran & Cole, P.C.

(57) ABSTRACT

A semiconductor device and method is provided that has an oxygen diffusion barrier layer between a high-k dielectric and BOX. The method includes depositing a diffusion barrier layer on a BOX layer and gate structure and etching a portion of the diffusion barrier layer from sidewalls of the gate structure. The method further includes depositing a high-k dielectric on the diffusion barrier layer and the gate structure.

11 Claims, 7 Drawing Sheets

U.S. PATENT DOCUMENTS

| | | |
|---|---|---|
| 2001/0041250 A1 | 11/2001 | Werkhoven et al. |
| 2002/0115252 A1 | 8/2002 | Haukka et al. |
| 2005/0142738 A1 | 6/2005 | Lee |
| 2006/0043421 A1 | 3/2006 | Doris et al. |
| 2008/0070366 A1 | 3/2008 | Doris et al. |
| 2009/0039426 A1 * | 2/2009 | Cartier et al. ............... 257/344 |

* cited by examiner

SEMICONDUCTOR DEVICE MANUFACTURING METHOD USING OXYGEN DIFFUSION BARRIER LAYER BETWEEN BURIED OXIDE LAYER AND HIGH K DIELECTRIC LAYER

FIELD OF THE INVENTION

The present invention relates to a semiconductor device and a method of manufacturing and, more particularly, to a semiconductor device having an oxygen diffusion barrier layer between a high-k dielectric and a buried oxide layer (BOX).

BACKGROUND

Generally, multi-gated non-planar CMOS technology includes metal-oxide semiconductor transistors having a buried oxide layer (BOX) layer formed on a substrate, e.g., a buried oxide layer in a semiconductor-on-insulator substrate. A gate stack, typically of metal and/or polysilicon, is formed on the BOX layer to form the transistor, itself. The gate stack can also include a nitride cap. A high-k dielectric material is blanket deposited on the BOX and the transistor, prior to the deposition of the gate conductor and further processes to complete the transistor.

The BOX layer, however, is susceptible to oxygen diffusion which can negatively affect the performance of the device. That is, outdiffusing oxygen into the high-k dielectric can have many deleterious affects on the performance of the device. For example, the outdiffusion of oxygen into the high-k dielectric can cause growth of extra oxide at the interface of the high-k dielectric and the semiconductor substrate. This, in turn, can result in an increase in equivalent oxide thickness (EOT) and Vt variation. More specifically, the outdiffusion of oxygen can change the work function of the device and hence cause Vt shift. Also, it is known that oxygen can lower the k-value of the high-k material. This, in turn, can negatively affect the device performance.

Accordingly, there exists a need in the art to overcome the deficiencies and limitations described hereinabove.

SUMMARY

In a first aspect of the invention, a method comprises depositing a diffusion barrier layer on a BOX layer and gate structure and etching a portion of the diffusion barrier layer from sidewalls of the gate structure. The method further comprises depositing a high-k dielectric on the diffusion barrier layer and the gate structure.

In another aspect of the invention, a structure comprises a BOX provided on a substrate and a gate structure formed on the BOX. A diffusion barrier film is deposited on the BOX and a high-k material is formed on the diffusion barrier film. The diffusion barrier film contacts sidewalls of the gate structure.

In a further aspect of the invention, a design structure is embodied in a machine readable medium for designing, manufacturing, or testing an integrated circuit. The design structure comprises: gate structure formed on a BOX; a nitride diffusion barrier film deposited on the BOX; and a high-k dielectric material formed on the nitride diffusion barrier film and contacting sidewalls of the gate structure.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The present invention relates to a semiconductor device and a method of manufacturing and, more particularly, to a semiconductor device having an oxygen diffusion barrier layer. Advantageously, the present invention prevents outdiffusion of oxygen from an underlying BOX layer to increase device performance. More specifically, the present invention provides a nitride barrier layer between a BOX and a high-k dielectric to prevent oxygen from diffusing into the high-k material which, in turn, can decrease the k value of the dielectric, increase an equivalent oxide thickness (EOT) of the device, and change the work function of the device by shifting Vt, e.g., increasing Vt. The devices manufactured using the processes of the present invention will benefit from such advantages.

Figure 1:
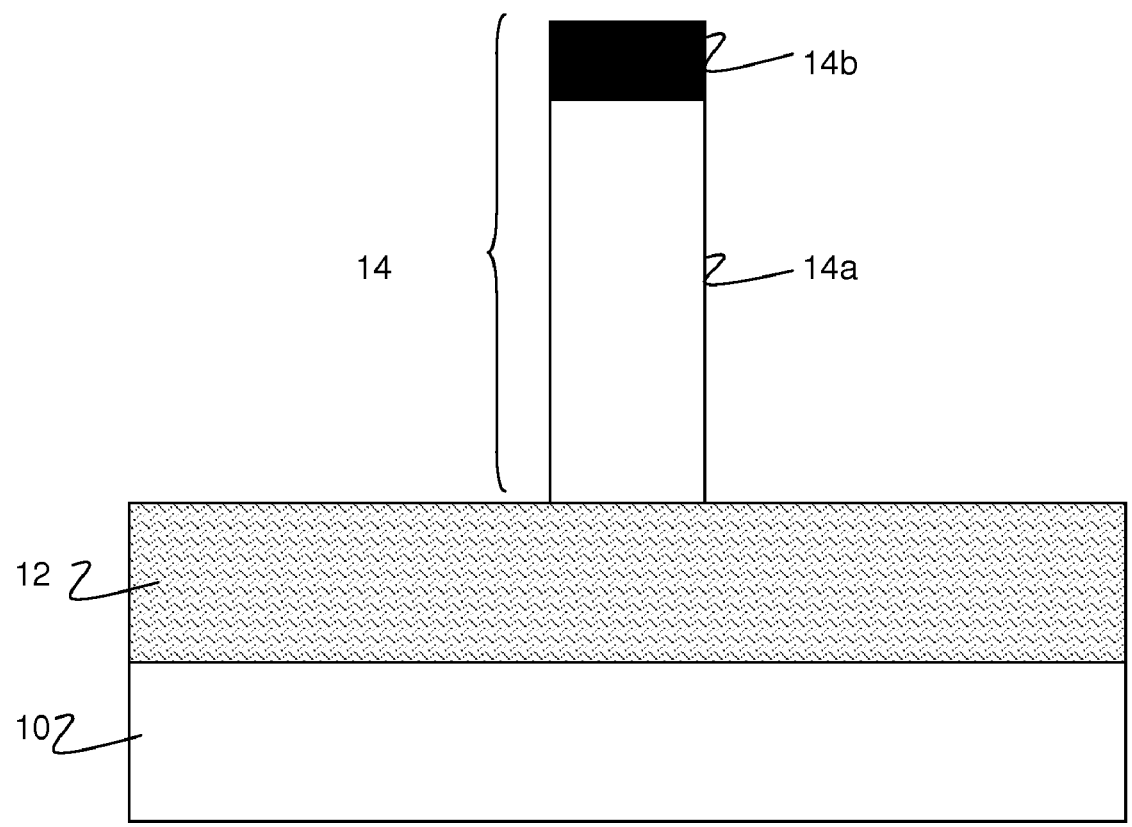
FIGS. 1-4 show intermediate structures and respective processing steps in accordance with aspects of the invention.

FIGS. 1-4 show intermediate structures and respective processing steps in accordance with the invention. In particular, FIG. 1 shows a BOX (buried oxide layer) 12 formed over an underlying substrate 10 using conventional deposition, bonding, and/or separation by implantation of oxygen (SIMOX) processes known to those of skill in the art. The BOX 12 may be a buried oxide layer in a semiconductor-on-insulator (SOI) substrate or an oxide in a trench isolation. In embodiments, the BOX 12 may be about 100 Å to 3000 Å in thickness; although this range of thickness should not be considered a limiting factor as other dimensions are also contemplated by the present invention. The substrate 10 can be a bulk semiconductor (e.g., silicon) or a portion of a semiconductor substrate which has a thickness of about 700 microns to 750 microns, as one example. It should be understood by those of skill in the art that the substrate can also vary in thickness depending on particular design applications.

Still referring to FIG. 1, a gate structure 14 is formed abutting the BOX 12 in a conventional manner. In one embodiment, the gate structure 14 is designed for use as a finFET. The gate structure 14 includes a semiconductor body 14a and a nitride cap 14b, formed through a conventional lithography and etching process such that further explanation is not required herein for a person of ordinary skill in the art to practice the invention. In alternate embodiments, the gate structure 14 can be formed using spacer image transfer techniques. The semiconductor body 14a can comprise any semiconductor material, including but not limited to silicon, germanium, silicon germanium, silicon carbide, III-V compound semiconductors (e.g., GaAs), II-VI compound semiconductors. A portion or entire portion of the semiconductor body 14a may be amorphous, polycrystalline, or monocrystalline. The semiconductor body 14a may be doped, undoped or contain doped regions and undoped regions therein. The semiconductor body 14a may contain regions with strain and regions without strain therein, or contain regions of tensile strain and compressive strain. In one embodiment, the body 14a is made of a silicon layer on an SOI (semiconductor-on-insulator) substrate, and can range in thickness from about 100 Å to 1000 Å and preferably 200 Å to 400 Å; although other dimensions are contemplated by the invention. The nitride cap 14b can range in thickness from about 100 Å to 500 Å, and preferably from about 200 Å to 300 Å.

Figure 2:
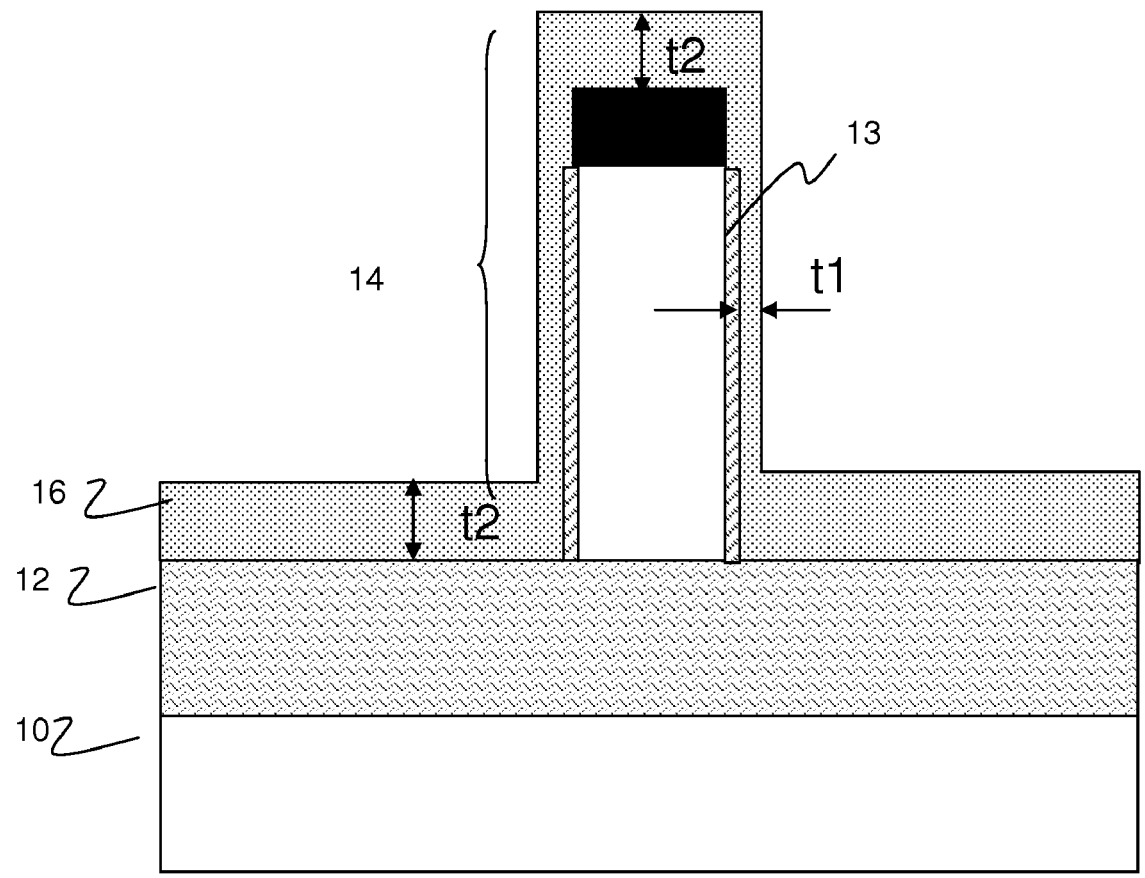

In FIG. 2, a nitride deposition process is performed to deposit a nitride film 16 on the structure of FIG. 1. More specifically, in embodiments, an anisotropic nitride deposition using, for example, high density plasma (HDP) techniques is used to form the nitride film 16. In embodiments, using an anisotropic nitride deposition, the nitride film 16 on the planar surface is thicker than that of the sidewall (e.g., vertical or substantially vertical) surfaces, e.g., t2>t1. In embodiments, t1 can range from about 20 Å to 50 Å, with t2 about two to three times greater than t1. In one non-limiting example, t1 is about 30 Å and t2 is about 80 Å. In embodiments, the nitride film 16 is a diffusion barrier film which is designed to block oxygen diffusion from the BOX 12 into a high-k gate dielectric which will be formed later. Optionally, a thermal oxidation process is performed to form an oxide liner 13 on the sidewall of the SOI body 14a before HDP nitride deposition. The oxide liner 13, when present, prevents damage on the SOI body 14a during the subsequent processes. For example, the oxide liner 13 prevents plasma damage on the surface of the SOI body 14a during the deposition of HDP nitride film 16. The oxide liner 13 is omitted in subsequent figures for simplicity.

Figure 3:
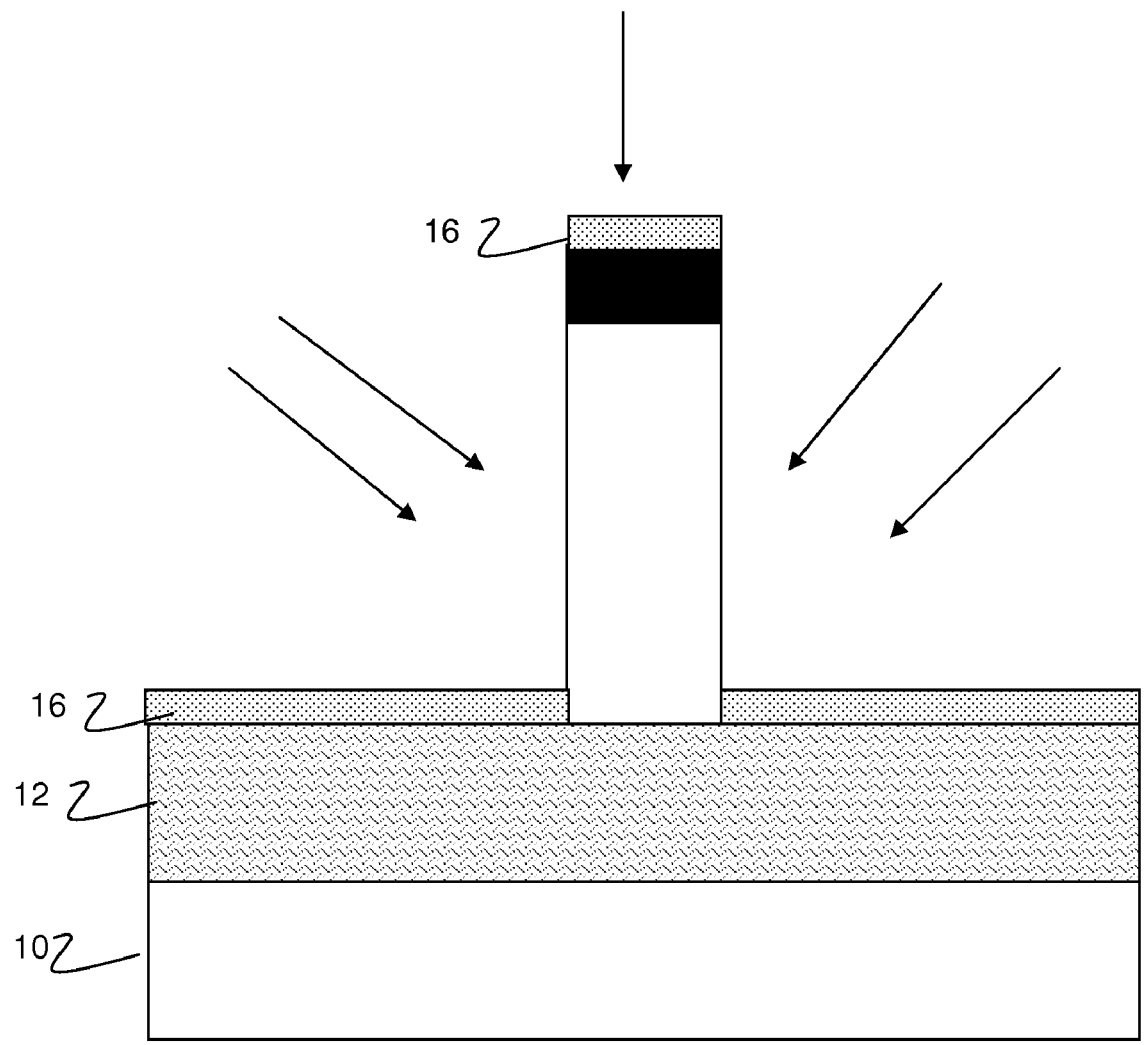

FIG. 3 shows an etch back process in accordance with the invention. In this implementation, the nitride sidewall on the gate structure 14 is removed using a conventional etching process, for example, a wet etch process with an etch solution containing hydrofluoric/ethylene glycol (HF/EG) or hot phosphoric acid (H3PO4). Alternatively, dry etch such as plasma downstream etch (CDE) can be used to etch the nitride film 16. This etching process also removes a portion of the nitride film 16 on the planar surface. The oxide liner 13, if present and not removed during the etch back process, can be removed from the sidewall of the semiconductor body 14a at this stage by a conventional etching process, for example, a wet etch process with a solution containing hydrofluoric acid (HF).

In a specific, non-limiting example, t1 is about 30 Å and t2 is about 80 Å. In this example, a 40 Å timed nitride etch is used to remove the 30 Å nitride film on the sidewalls of the gate structure 14. This process leaves about a 40 Å thick nitride film on the planar surfaces (e.g., on the BOX 12 and cap 14b). In embodiments, the 40 Å nitride film 16 is sufficient to block oxygen diffusion from the BOX 12 into a high-k gate dielectric.

Figure 4:
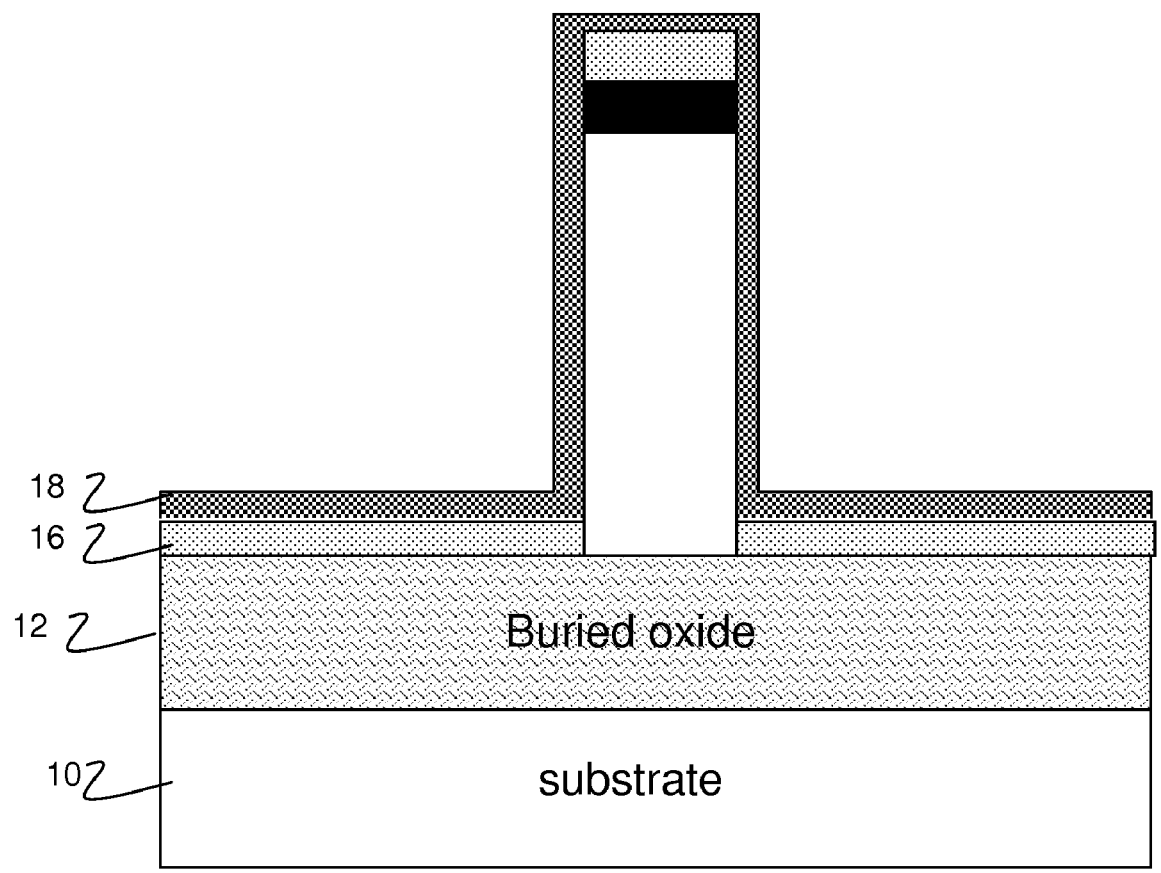

In FIG. 4, a high-k dielectric 18 is deposited on the structure of FIG. 4. In embodiments, the high-k dielectric 18 is deposited over the nitride film 16, which prevents oxygen out-diffusing from the BOX 12. In embodiments, the high-k dielectric can be deposited using a conventional chemical vapor deposition (CVD) process, an atomic layer deposition (ALD) process, molecular layer deposition (MLD), rapid thermal chemical vapor deposition (RTCVD), in-situ radical assisted deposition, ultrahigh vacuum chemical vapor deposition (UHVCVD), metallorganic chemical vapor deposition (MOCVD), physical vapor deposition, electron beam deposition, laser assisted deposition, and/or chemical solution deposition. Examples of the high-k dielectric 18 include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate, an any combination of these materials. The high-k dielectric 18 can be deposited in the range of about 15 Å to 100 Å and typically in the range of about 15 Å to 30 Å; although, other dimensions are also contemplated by the invention. Optionally, an interfacial layer (not shown) such as silicon oxide, silicon nitride, or silicon oxynitride can be formed on the exposed surface of the SOI body 14a before deposition of the high-k dielectric 18. The interfacial layer can be formed by thermal oxidation, thermal nitridation, plasma oxidation, plasma nitridation, chemical oxidation, or any combination of those methods.

Figure 5:
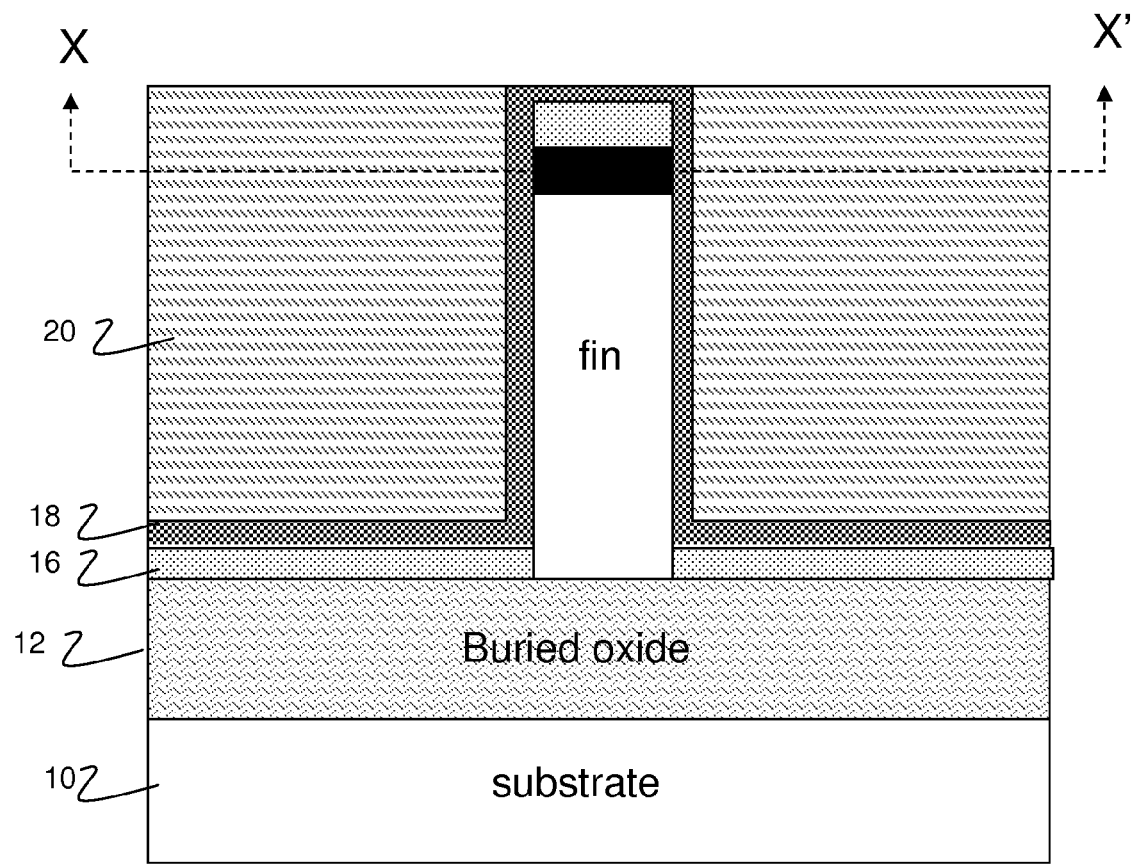
FIG. 5 shows a final structure and respective processing steps according to the aspects of the invention.

FIG. 5 shows the formation of a gate conductor 20. In embodiments, the gate conductor 20 is deposited on the structure of FIG. 4. The gate conductor 20 can be a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, titanium nitride, tantalum nitride, ruthenium oxide, cobalt silicide, nickel silicide), conductive carbon, polycrystalline or amorphous silicon, germanium, silicon germanium, or any suitable combination of these materials known to those of skill in the art. The conductive material may further comprise dopants that are incorporated during or after deposition. The gate conductor 20 can be deposited, for example, by atomic layer deposition (ALD), molecular layer deposition (MLD), chemical vapor deposition (CVD), physical vapor deposition, sputtering, plating, evaporation, ion beam deposition, electron beam deposition, laser assisted deposition, and chemical solution deposition, or any suitable combination of those methods. In embodiments, after deposition, the gate conductor 20 is planarized using conventional processes, for example, chemically mechanical polishing (CMP). Conventional processes are performed after the deposition of the gate conductor 20 to complete finFET formation, which do not require further explanation to those of skill in the art.

Figure 6:
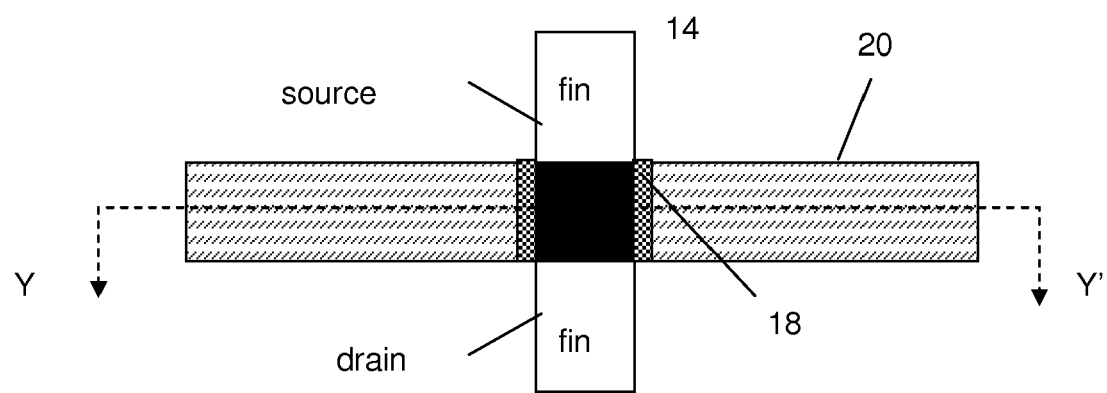
FIG. 6 shows a cross sectional view of a finFET of FIG. 5 according to the aspects of the invention.

FIG. 6 shows a cross sectional view of the finFET of FIG. 5, along X-X. Specifically, FIG. 6 shows the source and drain of the finFET, in addition to the structures described herein.

The resulting integrated circuit chips of each aspect of the invention can be distributed by the fabricator in raw wafer form (that is, as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Design Structure

Figure 7:
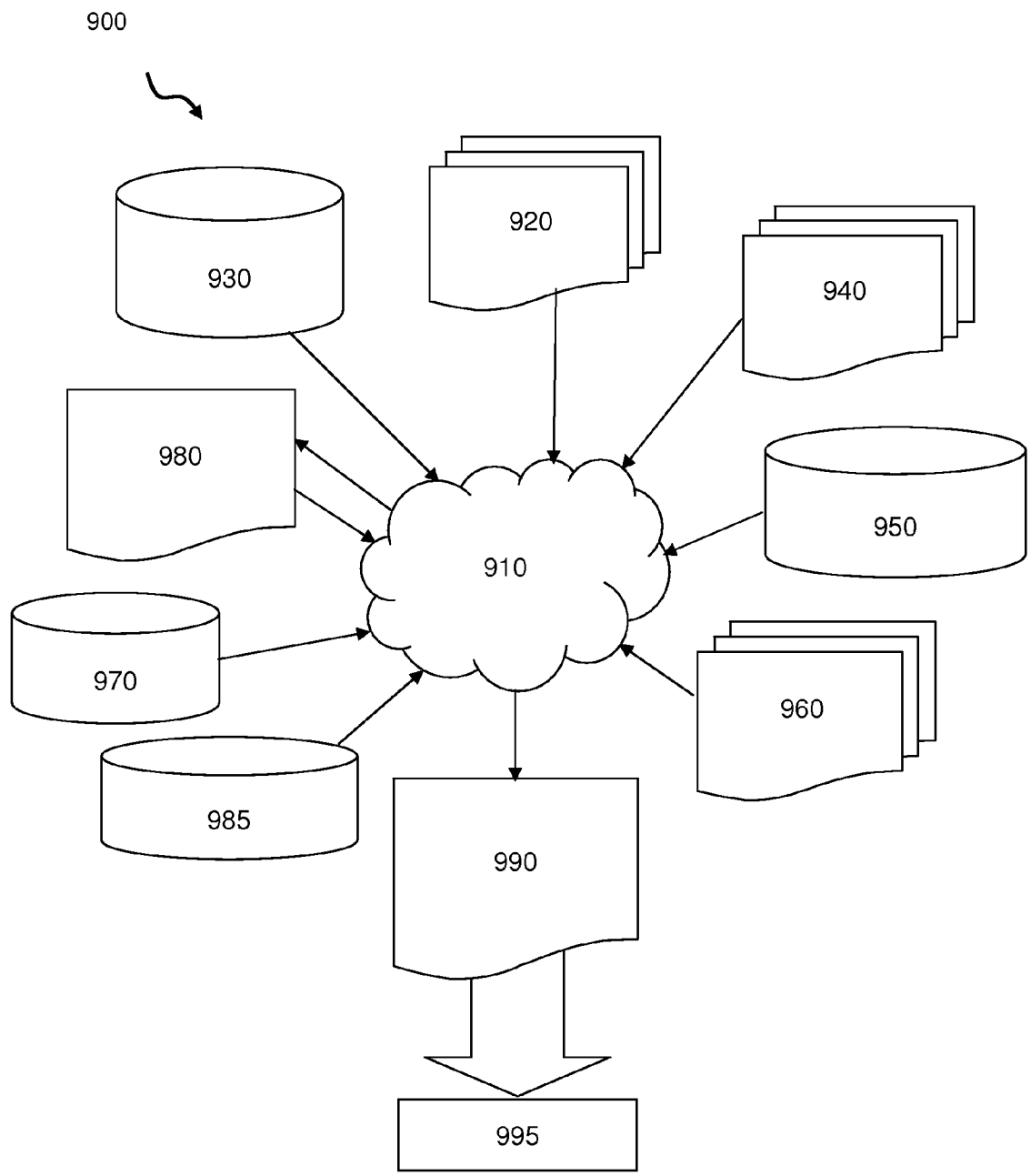
FIG. 7 is a flow diagram of a design process used in semiconductor design, manufacture, and/or test.

FIG. 7 shows a block diagram of an exemplary design flow 900 used for example, in semiconductor IC logic design, simulation, test, layout, and manufacture. Design flow 900 includes processes and mechanisms for processing design structures or devices to generate logically or otherwise functionally equivalent representations of the design structures and/or devices described above and shown in FIGS. 5 and 6. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 7 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 5 and 6. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 5 and 6 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 5 and 6. In one embodiment, design structure 990 may comprise a compiled, executable HDL simulation model that functionally simulates the devices shown in FIGS. 5 and 6.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 5 and 6. Design structure 990 may then proceed to a stage 995 where, for example, design structure 990: proceeds to tape-out, is released to manufacturing, is released to a mask house, is sent to another design house, is sent back to the customer, etc.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A method comprising:
   depositing a diffusion barrier layer on a BOX layer and gate structure;
   etching a portion of the diffusion barrier layer from sidewalls of the gate structure; and
   depositing a high-k dielectric on the diffusion barrier layer and the gate structure.

2. The method of claim 1, wherein the depositing the diffusion barrier layer is an anisotropic deposition process.

3. The method of claim 2, wherein the anisotropic deposition process results in the diffusion barrier layer having a first thickness on a planar surface of the gate structure and the BOX layer and a second thickness on the sidewalls of the gate structure.

4. The method of claim 3, wherein the first thickness is t2 and the second thickness is t1, and t2>t1.

5. The method of claim 4, wherein t2 is about two to three times the thickness of t1.

6. The method of claim 1, wherein the etching thins the diffusion barrier layer on a planar surface of the BOX layer and the gate structure and removes the diffusion barrier layer from the sidewalls of the gate structure.

7. The method of claim 1, wherein the barrier layer is a nitride film that prevents outdiffusing of oxygen from the BOX layer into the high-k dielectric.

8. The method of claim 1, wherein the depositing the diffusion barrier layer is a high density plasma process resulting in a planar surface being thicker than a surface on the sidewalls of the gate structure.

9. The method of claim 1, wherein the etching is a timed nitride etch.

10. The method of claim 1, wherein the diffusion barrier layer is a nitride film provided on the BOX layer in a thickness of about 40 Å after the etching.

11. The method of claim 1, further comprising depositing a gate conductor material on the high-k dielectric.

* * * * *